US012096561B2

(12) United States Patent
Armiento et al.

(10) Patent No.: US 12,096,561 B2
(45) Date of Patent: Sep. 17, 2024

(54) NANOCOMPOSITE MATERIAL FOR ULTRAVIOLET CURABLE DIRECT WRITE SEMICONDUCTOR APPLICATIONS

(71) Applicants: Raytheon Company, Waltham, MA (US); The University of Massachusetts, Lowell, MA (US)

(72) Inventors: Craig A. Armiento, Acton, MA (US); Yuri Piro, Boston, MA (US); Andrew M. Luce, Marlborough, MA (US); Emily Lamport, Pelham, NH (US); Oshadha Ranasingha, Salem, NH (US); Christopher R. Areias, Lawrence, MA (US); Christopher N. Kuncho, Attleboro, MA (US); Alkim Akyurtlu, Arlington, MA (US); Edward D. Kingsley, Stow, MA (US)

(73) Assignees: RAYTHEON COMPANY, Waltham, MA (US); THE UNIVERSITY OF MASSACHUSETTS, Lowell, MA (US)

( * ) Notice: Subject to any disclaimer, the term of this patent is extended or adjusted under 35 U.S.C. 154(b) by 182 days.

(21) Appl. No.: 17/515,870

(22) Filed: Nov. 1, 2021

(65) Prior Publication Data
US 2023/0139276 A1    May 4, 2023

(51) Int. Cl.
*H05K 1/18* (2006.01)
*C09D 11/037* (2014.01)
(Continued)

(52) U.S. Cl.
CPC .......... *H05K 1/183* (2013.01); *C09D 11/037* (2013.01); *C09D 11/101* (2013.01);
(Continued)

(58) Field of Classification Search
CPC .. H05K 1/183; H05K 3/30; H05K 2201/0112; H05K 2201/0137;
(Continued)

(56) References Cited

U.S. PATENT DOCUMENTS

| 4,533,445 A | 8/1985 | Orio |
| 7,485,569 B2 | 2/2009 | Ryu et al. |

(Continued)

FOREIGN PATENT DOCUMENTS

| EP | 2608260 A2 | 6/2013 |
| JP | H0946046 A | 2/1997 |

OTHER PUBLICATIONS

Pezzana, L., et al., 3D Printing of PDMS-Like Polymer Nanocomposites with Enhanced Thermal Conductivity: Boron Nitride Based Photocuring System (2021), Nanomaterials 11, 373, pp. 1-16.
(Continued)

*Primary Examiner* — Andargie M Aychillhum
(74) *Attorney, Agent, or Firm* — CANTOR COLBURN LLP

(57) ABSTRACT

A chip-embedded printed circuit board includes a cavity in a printed circuit board, a chip in the cavity of the printed circuit board, and a thixotropic dielectric filler in a gap in the cavity to seal the chip in the printed circuit board.

17 Claims, 5 Drawing Sheets

(51) Int. Cl.
  *C09D 11/101* (2014.01)
  *C09D 11/102* (2014.01)
  *H05K 3/30* (2006.01)

(52) U.S. Cl.
  CPC .......... *C09D 11/102* (2013.01); *H05K 3/30* (2013.01); *H05K 2201/0112* (2013.01); *H05K 2201/0137* (2013.01); *H05K 2201/0209* (2013.01)

(58) Field of Classification Search
  CPC .......... H05K 2201/0209; C09D 11/037; C09D 1/101; C09D 11/102
  USPC ........................................................ 361/762
  See application file for complete search history.

(56) References Cited

U.S. PATENT DOCUMENTS

| | | | |
|---|---|---|---|
| RE47,635 E | 10/2019 | Pujari et al. | |
| 2006/0291173 A1 | 12/2006 | Cho et al. | |
| 2007/0074900 A1 | 4/2007 | Lee et al. | |
| 2016/0249450 A1* | 8/2016 | Min | H05K 3/4608 |
| 2018/0288296 A1* | 10/2018 | Wang | G02B 13/004 |
| 2019/0092993 A1 | 3/2019 | Naik et al. | |
| 2021/0189042 A1 | 6/2021 | Seth et al. | |

OTHER PUBLICATIONS

Sadej, M., et al., Photocurable acrylate-based composites with enhanced thermal conductivity containing boron and silicon nitrides (2018), Express Polymer Letters vol. 12, No. 9, pp. 790-807.
Zhang, Z., et al., Preparation and dielectric properties of BaTiO3/epoxy nanocomposites for embedded capacitor application, Composites Science and Technology 97 (2014), pp. 100-105.
Machine Translation for JPH0946046 (A), Published: Feb. 14, 1997, 10 pages.
Notification of Transmittal of the International Search Report and the Written Opinion of the International Searching Authority, or the Declaration; PCT/US2022/041866; dated Dec. 7, 2022, 16 pages.
Norland NEA121 Electronic Adhesive [retrieved on Nov. 9, 2023]. Retrieved from the internet: https://www.norlandprod.com/adhesives/NEA%20121.html, 2 pages.

* cited by examiner

NANOCOMPOSITE MATERIAL FOR ULTRAVIOLET CURABLE DIRECT WRITE SEMICONDUCTOR APPLICATIONS

GOVERNMENT LICENSE RIGHTS

This disclosure was made with Government support through NextFlex, a Manufacturing Innovation Institute established by the Department of Defense Manufacturing Technology Program as a public-private partnership and is funded through the AFRL Cooperative Agreement FA8650-20-2-5506. The Government has certain rights in the disclosure.

BACKGROUND

The present disclosure relates to composite ultraviolet curable composite materials, and more specifically to nanocomposite materials for ultraviolet curable direct write semiconductor applications.

Conventional printed circuit boards have a mounted electronic component, or chip, on the surface of a bottom wiring layer. An insulation layer and top wiring layer are laminated on top of the chip, and via holes are formed for the electrical connection between the wiring layers and chip.

In response to demands for electronic devices with greater capabilities and smaller sizes, the recent technology trend is towards more densified and miniaturized electronic components. The demand is thus increasing for smaller printed circuit boards that allow high-density mounting of electronic components. Accordingly, multilayer circuit boards are being developed to provide electrical connection between wiring layers or between wiring and electrical components formed on different layers through via holes. The multilayer circuit board reduces the wiring that interconnects electronic components and provides high-density wiring, which increases the surface area of the printed circuit board, as well as provides superior electrical characteristics.

SUMMARY

According to one or more embodiments, a chip-embedded printed circuit board includes a cavity in a printed circuit board, a chip in the cavity of the printed circuit board, and a thixotropic dielectric filler in a gap in the cavity to seal the chip in the printed circuit board.

According to other embodiments, a composition for making a dielectric filler includes a plurality of particles with an aspect ratio of about 2:1 to about 30:1, an acrylate oligomer, a photoinitiator that absorbs light with a wavelength of about 280 to about 320 nanometers, and a photoinitiator that absorbs light with a wavelength of about 320 to about 400 nanometers.

Yet, according to other embodiments, a method of embedding a chip in a printed circuit board includes forming a cavity in the printed circuit board, placing the chip in the cavity in the printed circuit board, and disposing a thixotropic dielectric filler in a gap in the cavity to seal the chip in the cavity of the printed circuit board.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As mentioned above, conventional printed circuit boards have a laminated chip mounted with solder on a surface, with metal filled vias connecting wiring layers above and below. However, creating such via holes are complicated processing steps.

Accordingly, described herein is a method of embedding a chip in a printed circuit board, which eliminates the via wiring and thereby reduces processing cost and device complexity. A cavity is formed in a printed circuit board, a chip is disposed in the cavity, and a direct write, UV curable, composite dielectric ink is provided for bridging gaps in the cavity between the chip and the circuit board to provide an embedded die, sealed by the printable gasket material. An interposer is disposed on the cavity to provide electrical connections to the chip. This composite dielectric material/ink is engineered to offer ideal gap filling capability using a thixotropic shear thinner effect, good thermal conductivity to aid heat dissipation, and opacity to allow for z-height laser detection in printing systems.

Figure 1A:
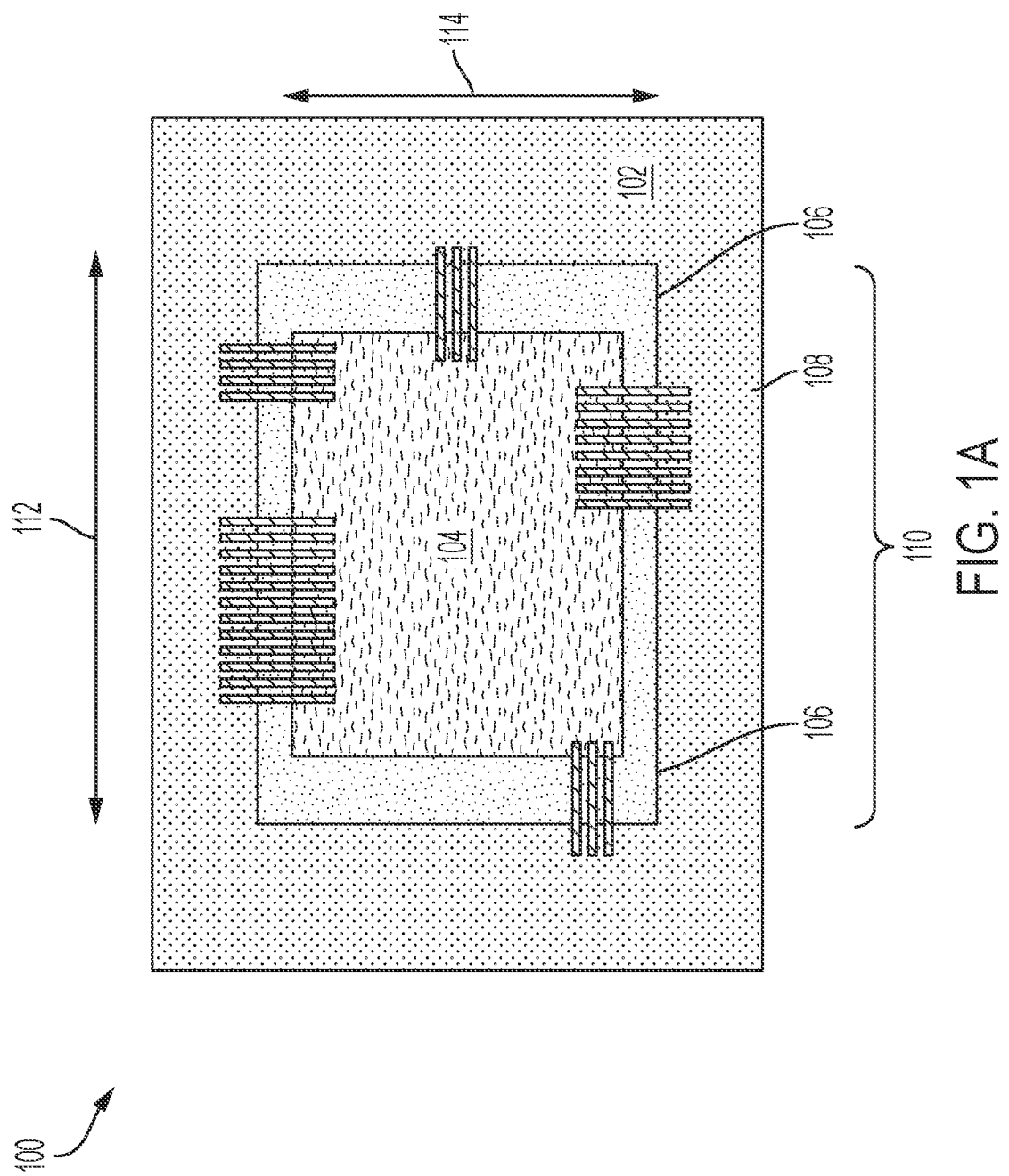
FIG. 1A is a top view of a chip embedded printed circuit board.
Figure 1B:
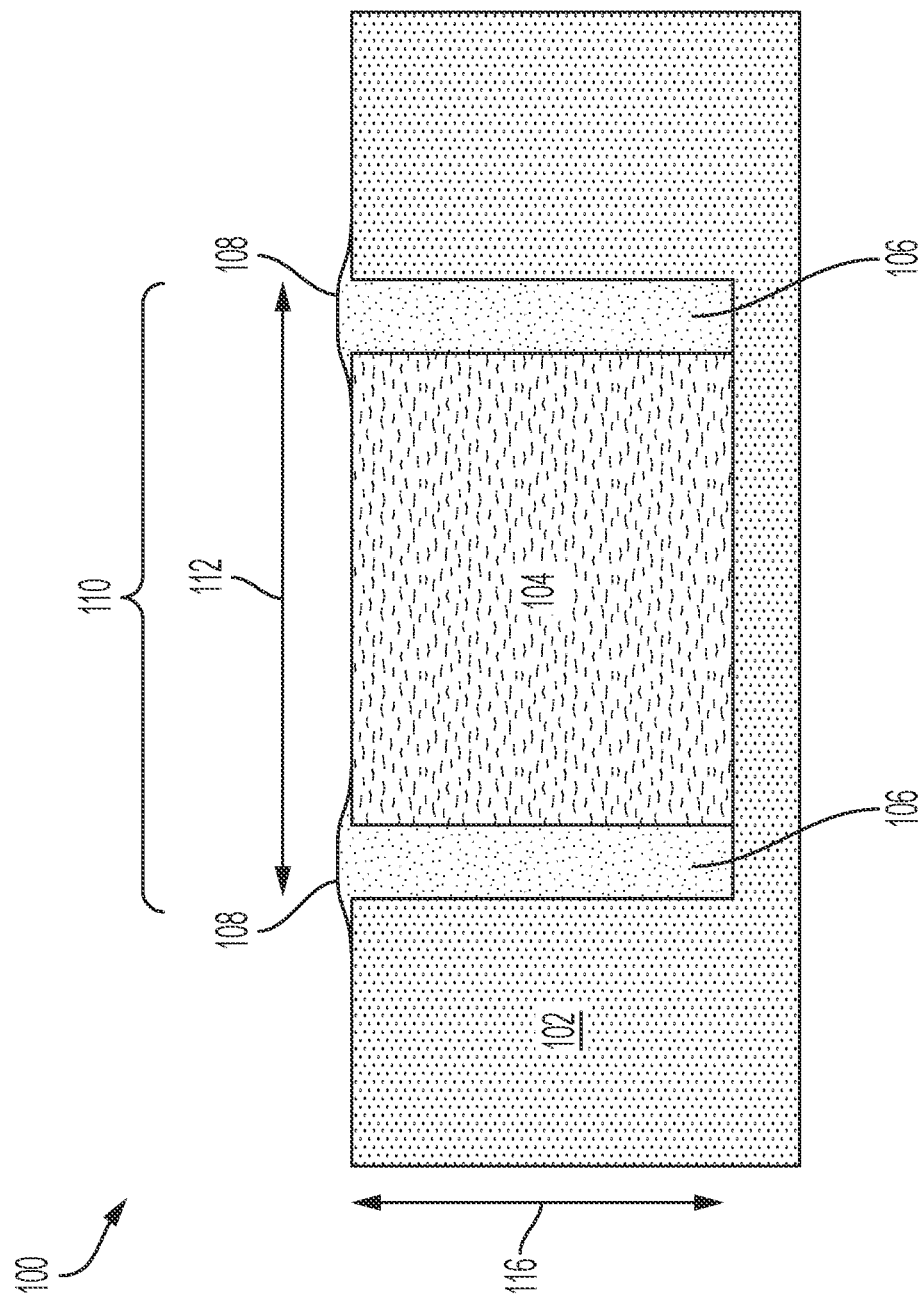
FIG. 1B is a cross-sectional side view of FIG. 1A.

FIG. 1A is a top view of a chip embedded printed circuit board 100. FIG. 1B is a cross-sectional side view of FIG. 1A. The chip embedded printed circuit board 100 includes substrate 102 that is the printed circuit board. The substrate 102 that is the printed circuit board is a laminated structure of conductive (such as copper) and insulating layers. The printed circuit board can be one sided (e.g., one copper layer), double-sided (two copper layers on both sides of one substrate layer), or multi-layer (outer and inner layers of copper, alternating with layers of insulator).

To embed the chip 104 in the substrate 102, a cavity 110 is formed substrate 102. The cavity 110 is formed by a processing method, which depends on the material(s) forming the substrate 102. The cavity 110 is formed by, for example, etching, pressing, drilling, laser processing, or a combination thereof. The cavity 110 formed has length 112 and width 114 dimensions (FIG. 1A) that are larger than the chip 104 to be embedded. The height 116 (or thickness, FIG. 1B) of the cavity 110 is substantially the same as the height (or thickness) of the chip 104 in some embodiments so that the surface of the chip 104 once embedded is substantially flush with the surface of the substrate 102. Yet, in other embodiments, the height 116 (or thickness) of the cavity 110 is smaller than the height (or thickness) of the chip 104, and the gap filler 106 is disposed or layered to function as a ramp up to the chip 104. After forming the cavity 110 in the substrate 102, the chip 104 is inserted into the cavity 110.

The chip 104 is also referred to as a die or electronic component. The chip 104 is a resistor or a capacitor.

The chip-embedded circuit board 100 includes a gap filler 106 in the gaps in the cavity 110 to form a gasket that seals the chip 104 in the substrate 102. The filler 106 is a thixotropic dielectric material. The gap filler 106 includes an inert inorganic filler that is a plurality of inorganic particles with high aspect ratios. The high aspect ratio of the particles, in a low viscosity liquid, will align in the direction of flow when shear is applied, which causes the shear thinning effect. This shear thinning gives way to smooth, high resolution prints. The inorganic particles of the gap filler 106 are thermally conductive, opaque, and do not absorb ultraviolet light such that it does not interfere with curing by ultraviolet light.

According to one or more embodiments, the high aspect ratio particles are hexagonal boron nitride particles. In some embodiments, the high aspect ratio particles have an aspect ratio of about 2:1 to about 30:1. In other embodiments, the high aspect ratio particles have an aspect ratio of about 10:1 to about 20:1.

According to one or more embodiments, the high aspect ratio particles have an average diameter of about 0.5 to about 1.2 micrometers. In other embodiments, the high aspect ratio particles have an average diameter of about 0.8 to about 1.0 micrometers.

In one or more embodiments, the high aspect ratio particles are in the gap filler 106 composition in an amount of about 5 to about 20 weight %. In other embodiments, the high aspect ratio particles are in the gap filler 106 composition in an amount of about 10 to about 15 weight %.

The gap filler 106 further includes a polymer matrix. In one or more embodiments, the polymer of the polymer matrix is a crosslinked polymer. In some embodiments, the polymer of the polymer matrix is an acrylate polymer or a crosslinked acrylate polymer, or a crosslinked epoxy acrylate polymer. Other non-limiting examples of the polymer of the polymer matrix include trimethylolpropane ethoxylate triacrylate, urethane acrylate, epoxy acrylate, polyester acrylate, or any combination thereof.

In one or more embodiments, the polymer matrix is formed from a combination of at least two oligomers, including a first oligomer with low viscosity and rapid initiation and a second oligomer that is a crosslinker that introduces crosslinks in the matrix to increase modulus and thermal stability. In some embodiments, the polymer matrix is formed from a combination of epoxy acrylate oligomers and epoxy triacrylate crosslinker oligomers, which create a strong three-dimensional polymeric network as a result of the three sites of unsaturation. The low viscosity oligomer has a viscosity of about 50 to about 1000 centipoise (cps) in some embodiments. In other embodiments, the low viscosity oligomer has a viscosity of about 200 to about 600 centipoise.

In one or more embodiments, the gap filler 106 is formed from a combination of a first low viscosity oligomer and a second crosslinking oligomer. The first oligomer is epoxy acrylate, and the second oligomer is epoxy triacrylate in embodiments. The first low viscosity oligomer is in the gap filler 106 in an amount of about 50 to about 95 weight % in embodiments. Yet, in other embodiments, the low viscosity oligomer is in the gap filler 106 in an amount of about 60 to about 85 weight %.

The gap filler 106 further includes one or more photoinitiators, photosensitizers, or a combination thereof. Photoinitiators absorb ultraviolet light energy to create free radicals, which react with monomers and/or oligomers to initiate polymerization and curing. The photoinitiators enable the gap filler 106 to cure by using ultraviolet light from an ultraviolet light source, such as a mercury lamp or light emitting diode lamp. When irradiated with ultraviolet light, Type I photoinitiators cleave to generate free radicals. When irradiated with ultraviolet light, Type II photoinitiators abstract a hydrogen from a coinitiator (amine synergist) to generate a radical.

In one or more embodiments, the gap filler 106 includes one or more photoinitiators that absorb ultraviolet light (wavelengths of 200 to 450 nanometers), for example, light having a wavelength range of 280 to 320 nanometer, 320 to 400 nanometers, or a combination thereof. In some embodiments, a combination of a Type 1 photoinitiator with long wavelength ultraviolet absorbance (320 to 400 nanometers) is combined with a Type 1 photoinitiator with a medium wavelength ultraviolet absorbance (280 to 320 nanometers). Non-limiting examples of suitable photoinitiators include phenylbis(2,4,6,7-trimethylbenzoyl) phosphine oxide; 2-methyl-4'-(methylthio)-2-morpholinopropiophenone; 4-benzoyl-4'methyldiphenylsulphide, benzildimethylketal); 2-benzyl-2-dimethylamino-1-(4-morpholinophenyl)-1-butanone; or a combination thereof.

In embodiments, the gap filler 106 further includes a photosensitizer in addition to one or more photoinitiators. The photosensitizer absorbs ultraviolet light and transfers the energy to another molecule, in particular, a photoinitiator, to generate a radical and initiate polymerization of the polymer. In one or more embodiments, the photosensitizer absorbs ultraviolet light. In some embodiments, the photosensitizer absorbs ultraviolet light with a wavelength of about 320 to about 400 nanometers. Non-limiting examples of photosensitizers include isopropylthioxanthone, benzophenone, or a combination thereof.

In some embodiments, a composition for making the gap filler 106 includes a plurality of particles with an aspect ratio of about 2:1 to about 30:1, an acrylate oligomer, a photoinitiator that absorbs light with a wavelength of about 280 to about 320 nanometers, and a photoinitiator that absorbs light with a wavelength of about 320 to about 400 nanometers. In embodiments, the composition further includes an acrylate crosslinker, a photosensitizer, or a combination thereof. The gap filler composition is sonicated and/or stirred until agglomerations are no longer visible. The gap filler is disposed or printed onto the substrate and then cured by exposing the gap filler to ultraviolet light from an ultraviolet light source.

The chip embedded printed circuit board 100 further includes a plurality of interposers 108 printed on the gap filler 106 to provide an electrical connection between the chip 104 and the substrate 102. The interposers 108 include, for example, silver.

Figure 2:
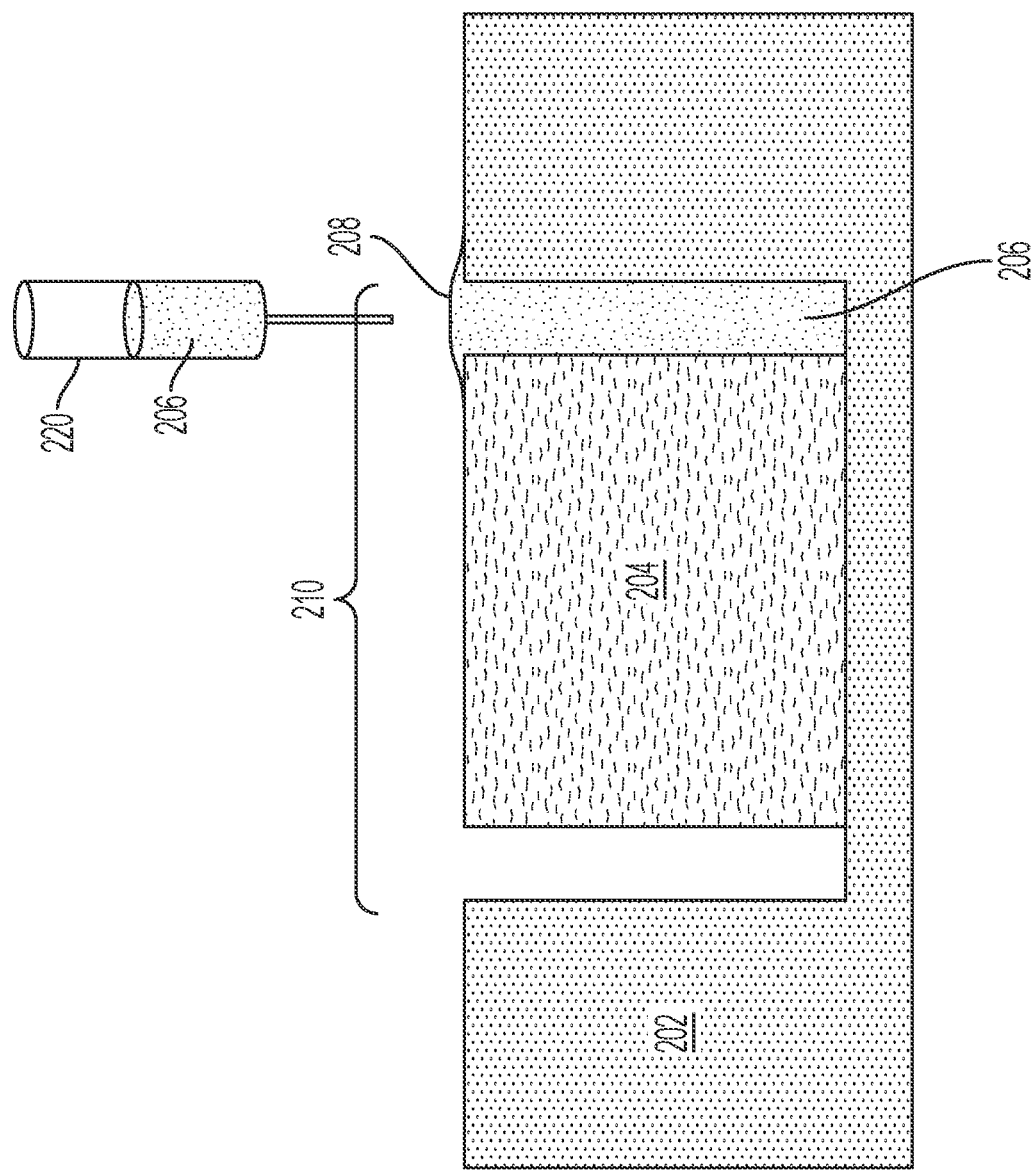
FIG. 2 is a cross-sectional side view of a method of using a gap filler to embed a chip in a printed circuit board.

FIG. 2 is a cross-sectional side view illustrating a method of embedding a chip 204 in a printed circuit board 202. The method includes forming a cavity 210 in the printed circuit board 202 and placing the chip 204 in the cavity in the printed circuit board 202. The method further includes disposing a thixotropic dielectric filler 206 in a gap in the cavity 210 to seal the chip 204 in the cavity of the printed circuit board 202. The method further includes forming interposers 208 on the gap filler 206 to provide an electrical connection between the chip 204 and the printed circuit board 202.

The thixotropic dielectric ink is injected, by a syringe 220 in some embodiments, into the gaps around the chip 204. Any method can be used to dispose the thixotropic dielectric filler 206 in the cavity 210. The thixotropic property of the filler 206 means that the shear thinning is time dependent. The filler 206 is thick or viscous under static conditions or low shear but become less viscous and will flow when shear stressed. In some embodiments, the viscosity of the filler 206 at a shear rate of 5 s$^{-1}$ is greater than the viscosity of the filler 206 at a shear rate of 50 s$^{-1}$. According to one or more embodiments, the filler 206 has a viscosity of about 10,000 to about 50,000 cps at a shear rate of 5 s$^{-1}$, and a viscosity of about 1,000 to about 10,000 at a shear rate of 50 s$^{-1}$. According other embodiments, the filler 206 has a viscosity of about 15,000 to about 30,000 cps at a shear rate of 5 s$^{-1}$, and a viscosity of about 2,500 to about 7,500 at a shear rate of 50 s$^{-1}$.

According to one or more embodiments, the filler 206 has a viscosity of about 25,000 to about 50,000 cps at a shear rate of 0 s$^{-1}$. According other embodiments, the filler 206 has a viscosity of about 30,000 to about 45,000 cps at a shear rate of 0 s$^{-1}$.

The dynamic viscosity of the filler 206 makes it an ideal electronic gap filler to embed a chip in a printed circuit board because it can simultaneously be subject to shear stress to flow into gaps between the chip and the printed circuit board and provide a surface that is smooth. The high content of particles with high aspect ratios (e.g., boron nitride) provides the filler with a strong thixotropic effect. The relatively high concentration of high aspect ratio particles also aids in thermal conductivity and laser detection which is an attractive attribute for a flexible gasket application.

The thixotropic shear thinning effect allows the filler to drop in viscosity when shear is applied to force it out of the syringe, then return to a high viscosity when shear is removed, leaving behind a smooth pattern with high resolution. In contrast, commercially available electronic fillers have surfaces that have unfavorably high viscosity, which results in a rough finish that cannot be printed on top of, or unfavorably low viscosities, with minimal shear thinning that results in capillary wetting on the sidewalls of the junction as well as loss at gaps at the base of the device.

In addition to the above gap filling applications, the dynamic viscosity properties of the fillers described herein make them suitable for other electronic applications, including any gap filling electronic applications or other electronic applications where the dielectric materials are needed to provide a ramp or elevated surface.

EXAMPLES

Comparative Example 1: Commercially Available Adhesives

Two commercially supplied materials were analyzed for favorable properties for filling gaps in a cavity between a chip and a printed circuit board. Norland Electronic Adhesive 121 (NEA 121) is a mercapto-ester/benzophenone composition and an adhesive for tacking, filling, sealing, conformal coating, and tamperproofing precision products. Creative Materials 119-48 (CM 119-48) is a screen-printable, flexible, UV-cured dielectric coating. A cavity was formed in a printed circuit board, and a chip was inserted into the cavity. NEA 121 and CM 119-48 were deposited in the gaps between the chip and the printed circuit board to assess their abilities to seal the chips and form an embedded printed circuit board.

NEA 121 had a viscosity that was too low (~300 cps) and demonstrated minimal shear thinning, which resulted in unfavorable capillary wetting on the side of the junction and material loss via gaps at the base of the device. CM 119-48 had the opposite problem and demonstrated an unfavorably high viscosity (~150,000 cps), which caused the material to maintain its shape and leave a rough surface finish. The rough surface finish was challenging to print silver on top of. Both NEA 121 and CM 119-48 demonstrated unfavorable thermal conductivity, which reduced heat transfer away from the device. Neither NEA 121 nor CM 119-48 were opaque, which would reduce the capabilities of the detection system used to map surface topology.

Example 2: Ink Formulations

Table 1 below shows examples of composite inks with demonstrated favorable properties for embedding a chip in a printed circuit board as described herein.

TABLE 1

Composite ink formulations

| | | Internal Ink ID | | |
|---|---|---|---|---|
| Ingredient | Type | #1 | #2 | #3 |
| Phenylbis(2,4,6,7-trimethylbenzoyl) phosphine oxide (Millipore Sigma) | Photoinitiator | 0.50% | 0.50% | 0.50% |
| 2-Methyl-4'-(methyl-thio)-2-morpholino-propiophenone (Millipore Sigma) | Photoinitiator and Amine Synergist | 0.50% | 0.50% | 0.50% |
| Isopropylthioxanthone (Millipore Sigma) | Photosensitizer | 0.50% | 0.50% | 0.50% |
| H-Boron Nitride (Millipore Sigma) | Inorganic filler | 15.50% | 15.5% | 10.50% |
| CN131 (Sartomer) | Epoxy Acrylate Oligomer | 83.00% | 73.00% | 78.00% |
| CN133 (Sartomer) | Epoxy Triacrylate Oligomer, Crosslinker | 0.00% | 10.00% | 10.00% |

The oligomers, boron nitride, photoinitiators, and sensitizer were added to a glass jar covered in aluminum foil. The jar was probe sonicated for 2 hours, with 10 second on-off cycles. The sample was checked every 30 minutes for agglomerations around the probe. If agglomerations were observed, the mixture was hand mixed until the agglomerations were broken down, and the probe was readministered. The final mixture should have no visible agglomerations.

Example 3: Dynamic Viscosity Characterization

Figure 3:
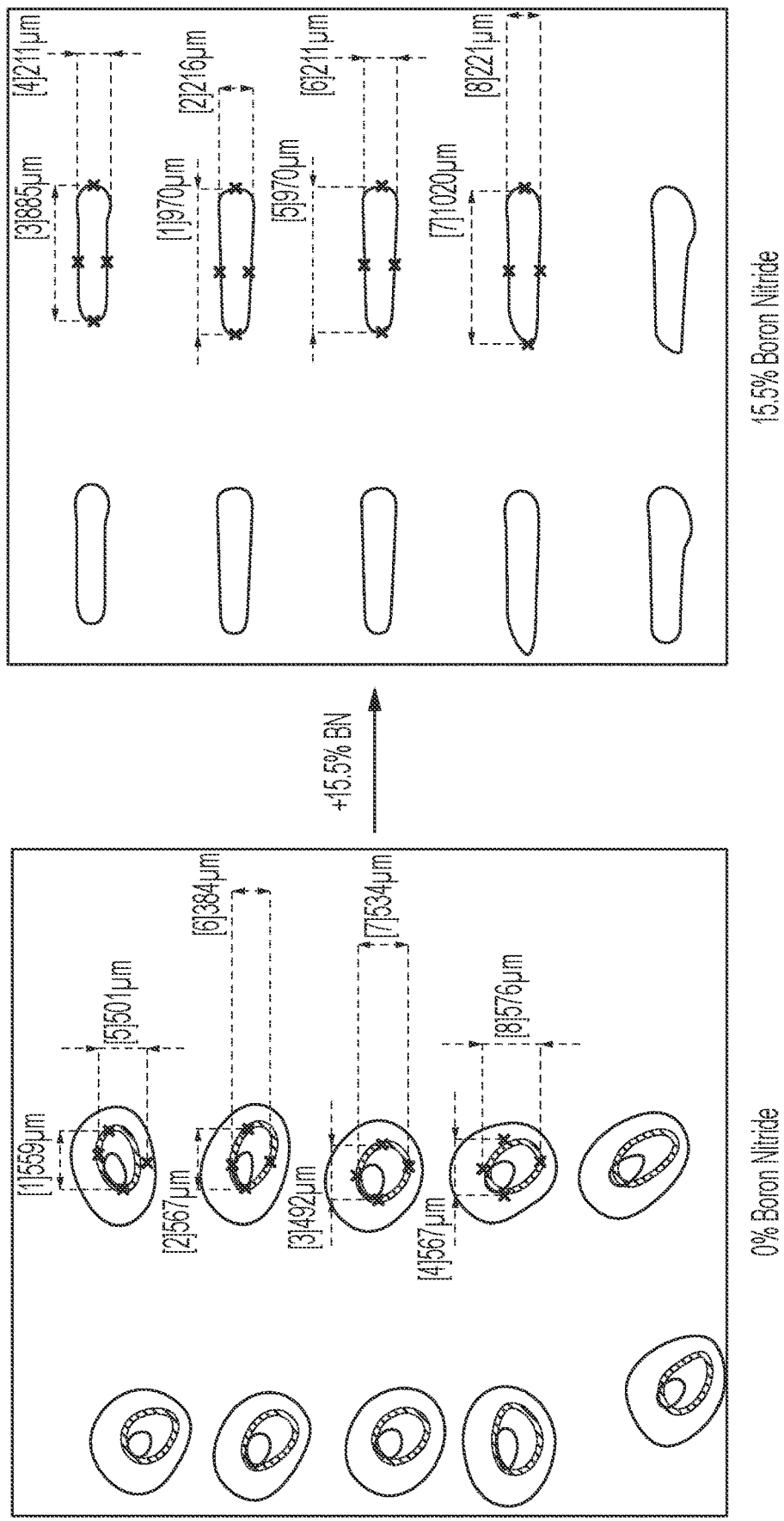
FIG. 3 show images of traces of a gap filler with and without boron nitride.

Composite ink formulations with and without boron nitride were analyzed for favorable viscosity. Ink formulation #1 with 15.50% boron nitride from Table 1 above was compared to a formulation without boron nitride (98.5% CN131, 0.5%, phenylbis(2,4,6,7-trimethylbenzoyl) phosphine oxide; 0.5% 2-methyl-4'-(methylthio) morpholinopropiophenone; 0.5% isopropylthioxanthone). A syringe was used to deposit lines of the inks, as shown in FIG. 3. Without boron nitride (left), the ink lines were shorter (492 to 567 micrometers) and wider (384 to 576 micrometers), and with 15.5% boron nitride (right), the ink lines were longer (885 to 1020 micrometers) and thinner (211 to 221 micrometers). Both inks were printed using the same printing procedure. This behavior demonstrates the effect of boron nitride on print resolution. The ink containing 15.5% boron nitride was able to print the intended geometry with greater accuracy compared to the ink containing no boron nitride.

Figure 4:
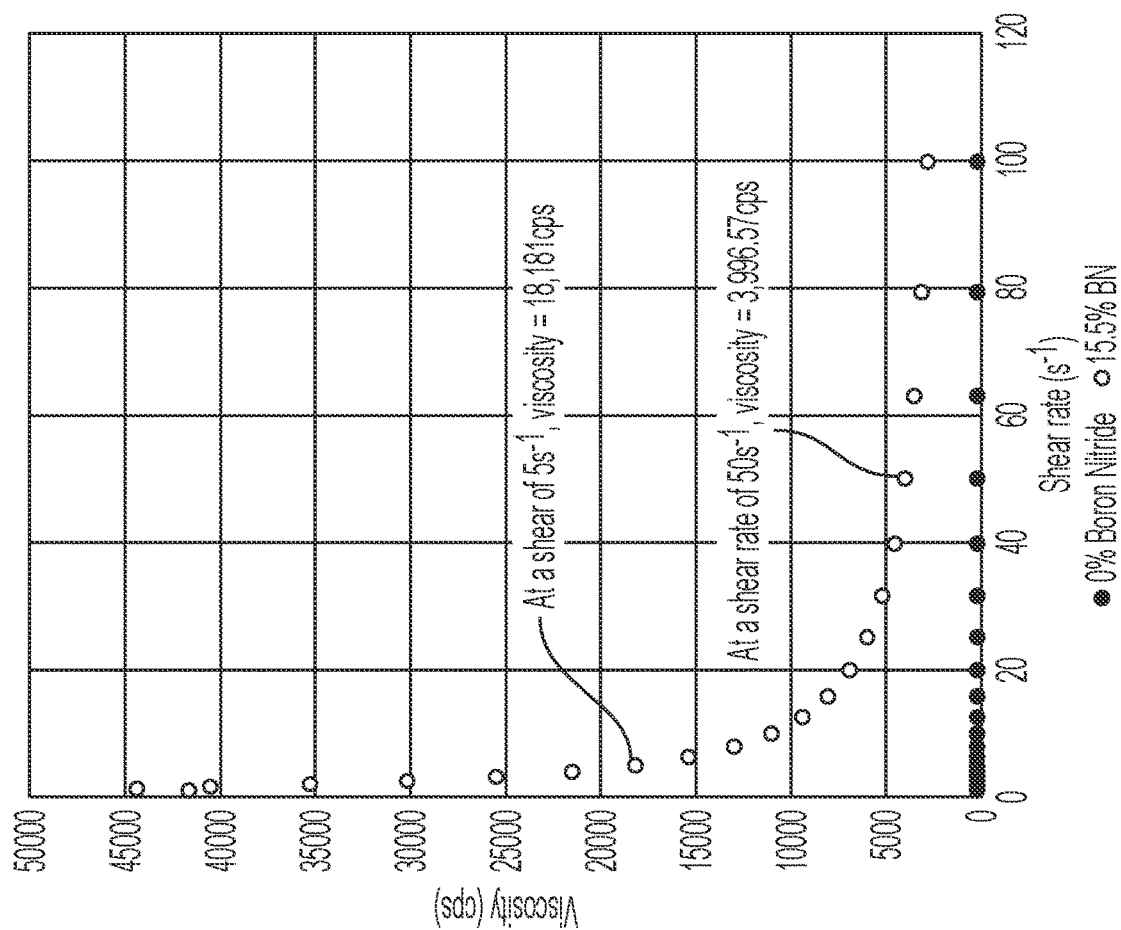
FIG. 4 is a graph showing dynamic viscosity in terms of shear rate ($s^{-1}$) as a function of viscosity (centipoise (cps)) of materials with and without boron nitride.

FIG. 4 is a graph showing viscosity (cps) of the inks as a function of shear rates ($s^{-1}$). Without boron nitride, the ink has a viscosity of 215 cps at all shear rates tested. With 15.5% boron nitride, the ink had a viscosity of ~18,181 cps at a shear of 5 $s^{-1}$, and a viscosity of ~3,996.67 cps at a shear rate of 50 $s^{-1}$ and therefore thixotropic behavior. The thixotropic index (ratio of viscosity at two different shear rates, 5 and 50 $s^{-1}$) was 4.55.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form detailed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the various embodiments with various modifications as are suited to the particular use contemplated.

While the preferred embodiments have been described, it will be understood that those skilled in the art, both now and in the future, may make various improvements and enhancements which fall within the scope of the claims which follow. These claims should be construed to maintain the proper protection for the disclosure as first described.

What is claimed is:

1. A chip-embedded printed circuit board comprising:
a cavity in a printed circuit board;
a chip in the cavity of the printed circuit board; and
a thixotropic dielectric filler in a gap in the cavity to seal the chip in the printed circuit board;
wherein the thixotropic dielectric filler includes:
a plurality of particles with an aspect ratio of about 2:1 to about 30:1;
an acrylate oligomer;
a photoinitiator that absorbs light with a wavelength of about 280 to about 320 nanometers; and
a photoinitiator that absorbs light with a wavelength of about 320 to about 400 nanometers.

2. The chip-embedded printed circuit board of claim 1, wherein the plurality of particles with an aspect ratio of about 2:1 to about 30:1 are boron nitride particles.

3. The chip-embedded printed circuit board of claim 1, wherein the thixotropic dielectric filler further comprises one or more photoinitiators, photosensitizers.

4. The chip-embedded printed circuit board of claim 1, wherein the epoxy acrylate polymer is a crosslinked epoxy acrylate polymer.

5. A composition for making a dielectric filler comprising:
a plurality of particles with an aspect ratio of about 2:1 to about 30:1;
an acrylate oligomer;
a photoinitiator that absorbs light with a wavelength of about 280 to about 320 nanometers; and
a photoinitiator that absorbs light with a wavelength of about 320 to about 400 nanometers.

6. The composition of claim 5, wherein the plurality of particles with the aspect ratio of about 2:1 to about 30:1 is boron nitride particles.

7. The composition of claim 5, further comprising a photosensitizer.

8. The composition of claim 5, further comprising an epoxy triacrylate crosslinker oligomer.

9. The composition of claim 5, wherein the acrylate oligomer is an epoxy acrylate oligomer.

10. The composition of claim 5, wherein the plurality of particles with the aspect ratio of about 2:1 to about 30:1 is present in the composition in an amount of about 5 to about 20 weight %.

11. The composition of claim 5, wherein the plurality of particles with the aspect ratio of about 2:1 to about 30:1 is in the composition in an amount of about 10 to about 15 weight %.

12. A method of embedding a chip in a printed circuit board, the method comprising:
forming a cavity in the printed circuit board;
placing the chip in the cavity in the printed circuit board; and
forming a dielectric filler from a composition according to claim 8;
disposing the dielectric filler in a gap in the cavity to seal the chip in the cavity of the printed circuit board.

13. The method of claim 12, wherein the dielectric filler further comprises one or more photoinitiators, photosensitizers, or a combination thereof.

14. The method of claim 13, wherein the one or more photoinitiators is a photoinitiator that absorbs ultraviolet light.

15. The method of claim 13, wherein the one or more photoinitiators absorbs light having a wavelength range of 280 to 320 nanometers, 320 to 400 nanometers, or a combination thereof.

16. The method of claim 12, wherein the dielectric filler comprises a plurality of particles with an aspect ratio of about 2:1 to about 30:1.

17. The method of claim 16, wherein the plurality of particles with the aspect ratio of about 2:1 to about 30:1 is boron nitride particles.

* * * * *